(12) United States Patent
Katsumata et al.

(10) Patent No.: US 11,229,123 B2
(45) Date of Patent: Jan. 18, 2022

(54) METHOD OF MANUFACTURING THE PRINTED BOARD

(71) Applicant: NICHIA CORPORATION, Anan (JP)

(72) Inventors: Masaaki Katsumata, Anan (JP); Masakazu Sakamoto, Tokushima (JP)

(73) Assignee: NICHIA CORPORATION, Anan (JP)

( * ) Notice: Subject to any disclaimer, the term of this patent is extended or adjusted under 35 U.S.C. 154(b) by 175 days.

(21) Appl. No.: 15/719,565

(22) Filed: Sep. 29, 2017

(65) Prior Publication Data

US 2018/0098434 A1 Apr. 5, 2018

(30) Foreign Application Priority Data

Sep. 30, 2016 (JP) .............................. JP2016-192932

(51) Int. Cl.
*H05K 3/00* (2006.01)
*H05K 3/42* (2006.01)
(Continued)

(52) U.S. Cl.
CPC ........... *H05K 3/0038* (2013.01); *H05K 1/036* (2013.01); *H05K 1/0366* (2013.01);
(Continued)

(58) Field of Classification Search
CPC .. H05K 3/0029; H05K 3/0038; H05K 3/0052; H05K 3/064; H05K 3/383;
(Continued)

(56) References Cited

U.S. PATENT DOCUMENTS 5,965,269 A * 10/1999 Inada ...................... H05K 3/386
428/413
7,435,352 B2 * 10/2008 Mok ....................... H05K 3/383
174/254
(Continued)

FOREIGN PATENT DOCUMENTS

JP 09-321432 12/1997
JP 2001-094007 4/2001
(Continued)

OTHER PUBLICATIONS

Machine Translation of Japanese Patent Publication JP 2004-273681, Sep. 2004. (Year: 2020).*
(Continued)

*Primary Examiner* — A. Dexter Tugbang
(74) *Attorney, Agent, or Firm* — Mori & Ward, LLP

(57) ABSTRACT

A method of manufacturing a printed board, the method comprising: a first step of preparing a laminate having a base member in which a plurality of layers of glass cloths and a plurality of resin layers are alternately laminated, a first metal layer attached to one surface of the base member, and a second metal layer attached an opposite surface of the base member; a second step of forming a protective layer removable with a predetermined solvent on each of the first metal layer and the second metal layer; and a third step of irradiating the laminate on which the protective layer is formed with a laser beam to thereby form a through-hole penetrating in a thickness direction of the laminate.

19 Claims, 11 Drawing Sheets

(51) Int. Cl.
  *H05K 1/03*  (2006.01)
  *H05K 3/40*  (2006.01)
  *H05K 3/06*  (2006.01)
  *H05K 3/38*  (2006.01)

(52) U.S. Cl.
  CPC .......... *H05K 3/0029* (2013.01); *H05K 3/064* (2013.01); *H05K 3/403* (2013.01); *H05K 3/429* (2013.01); *H05K 3/0052* (2013.01); *H05K 3/383* (2013.01); *H05K 3/384* (2013.01); *H05K 3/386* (2013.01); *H05K 3/427* (2013.01); *H05K 2201/029* (2013.01); *H05K 2203/1383* (2013.01); *Y10T 29/49165* (2015.01)

(58) Field of Classification Search
  CPC ........ H05K 3/384; H05K 3/403; H05K 3/427; H05K 3/429; H05K 2203/1383; H05K 1/036; H05K 1/0366; H05K 2201/029; H05K 3/386; Y10T 29/49165
  See application file for complete search history.

(56) References Cited

U.S. PATENT DOCUMENTS

| | | | |
|---|---|---|---|
| 8,136,240 B2 * | 3/2012 | Kuczynski | H05K 3/429 29/852 |
| 2005/0230365 A1 * | 10/2005 | Lei | H05K 3/0038 219/121.71 |
| 2005/0236975 A1 | 10/2005 | Addington et al. | |
| 2006/0254052 A1 * | 11/2006 | Miura | Y10T 29/49165 29/846 |
| 2007/0181543 A1 | 8/2007 | Urairi et al. | |
| 2008/0210462 A1 | 9/2008 | Kawagishi et al. | |
| 2010/0243601 A1 * | 9/2010 | Uematsu | H05K 3/0038 216/20 |
| 2015/0118463 A1 * | 4/2015 | Nakamura | H05K 1/036 428/212 |
| 2016/0008920 A1 | 1/2016 | Goya et al. | |

FOREIGN PATENT DOCUMENTS

| | | | | |
|---|---|---|---|---|
| JP | 2001-230519 | | 8/2001 | |
| JP | 2003-209330 | | 7/2003 | |
| JP | 2003-324263 | | 11/2003 | |
| JP | 2003-347736 | | 12/2003 | |
| JP | 2004-146427 | | 5/2004 | |
| JP | 2004273681 A | * | 9/2004 | |
| JP | 2004-351513 | | 12/2004 | |
| JP | 2005-186110 | | 7/2005 | |
| JP | 2005-310771 | | 11/2005 | |
| JP | 2006-165242 | | 6/2006 | |
| JP | 2009-192783 | | 8/2009 | |
| JP | 2010226147 A | * | 10/2010 | .......... H05K 3/0038 |
| JP | 2014-161904 | | 9/2014 | |
| WO | 2007/060784 | | 5/2007 | |

OTHER PUBLICATIONS

Machine Translation of Japanese Patent Publication JP 2001-230519, Aug. 2001. (Year: 2020).*

* cited by examiner

METHOD OF MANUFACTURING THE PRINTED BOARD

CROSS-REFERENCE TO RELATED APPLICATION

This application claims priority under 35 U. S. C. § 119 to Japanese Patent Application No. 2016-192932 filed on Sep. 30, 2016, the contents of this application are hereby incorporated herein by reference in their entirety.

BACKGROUND

Technical Field

The present disclosure relates to a method of manufacturing the printed board.

Description of Related Art

Printed boards often use a resin such as epoxy resin or a polyimide resin as an insulating material. Also, as a multi-layer printed wiring board, a double-sided copper-clad laminate is sometimes used which includes a base member made of glass cloth and epoxy resin, and copper foils on the base member's surfaces, for example. Such printed boards including resin layers are provided with a plurality of through-holes for various purposes. Conventionally, through-holes have been formed by machine processing using drills, rooters, and the like. In recent years, through-holes are formed by laser machining in some situation.

However, applying a laser beam to a board, which is a workpiece, produces decomposed matters (board materials). If the decomposed matters adhere to the surfaces of the board, they adversely affect subsequent steps, thus lowering the quality of a printed board. In particular, if molten glass adheres, it will be difficult to detach it. For machining a board through ablation with ultraviolet absorption of a laser beam, a technique has conventionally been known in which a protective sheet is attached to the laser incident surface of the board to prevent adhesion of decomposed matters to the surface of the board, as for example disclosed in Japanese Unexamined Patent Application Publication No. 2005-186110.

SUMMARY OF INVENTION

A method of manufacturing a printed board, according to an embodiment of the present disclosure includes: a first step of preparing a laminate having a base member in which a plurality of layers of glass cloths and a plurality of resin layers are alternately laminated, a first metal layer attached to one surface of the base member, and a second metal layer attached an opposite surface of the base member; a second step of forming a protective layer removable with a predetermined solvent on each of the first metal layer and the second metal layer; and a third step of irradiating the laminate on which the protective layer is formed with a laser beam to thereby faun a through-hole penetrating in a thickness direction of the laminate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DETAILED DESCRIPTION OF EMBODIMENTS

Figure 1:
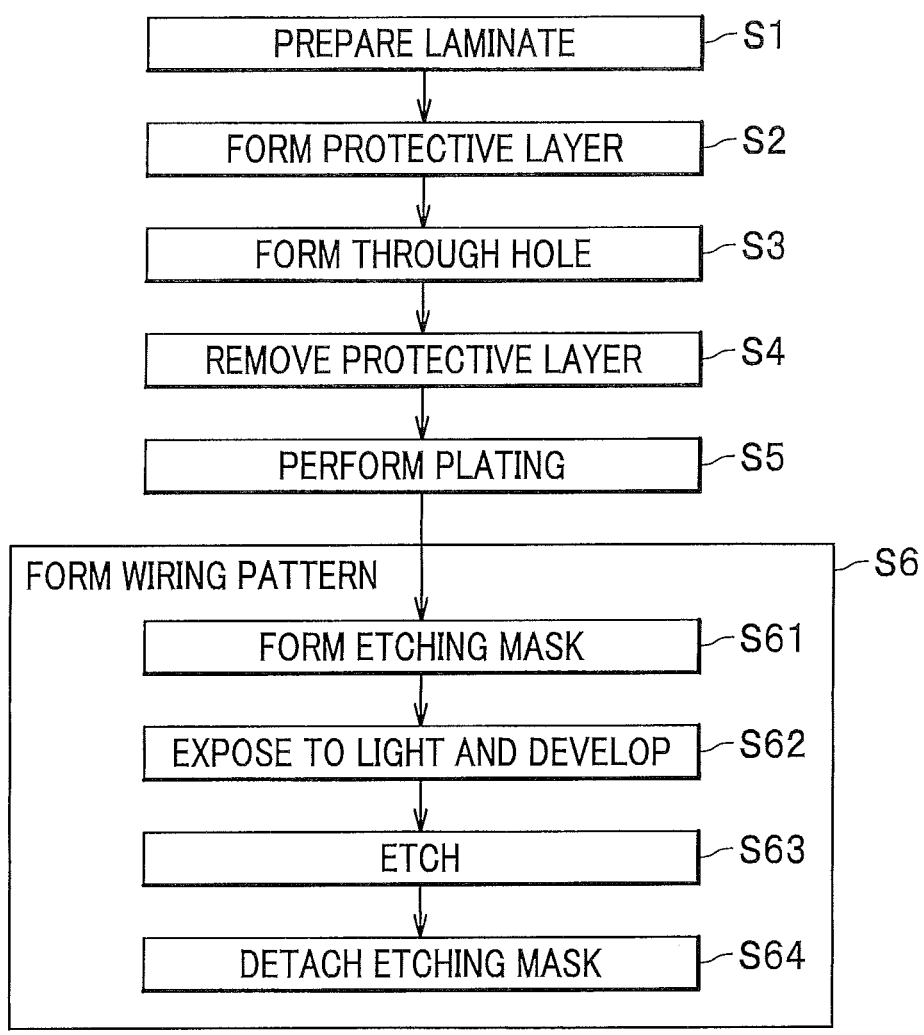
FIG. 1 is a flowchart illustrating the procedure of a method for manufacturing the printed board according to an embodiment.

The embodiments will now be described with reference to the accompanying drawings, wherein like reference numerals designate corresponding or identical elements throughout the various drawings.

A method for manufacturing the printed board according to an embodiment will be described below. It is to be noted that the drawings to be referred to in the following description schematically illustrate the embodiment. Therefore, the proportions, spacing, positional relationship, and/or the like of members may be exaggerated or illustration of some members may be omitted. Further, the proportions and spacing of members may not be identical between plan views and their corresponding cross-sectional views. Furthermore, in the following description, identical names and reference signs denote the same or homogeneous member in principle, and detailed description thereof will be omitted as appropriate.

Printed Board Manufacturing Method

Figure 2:
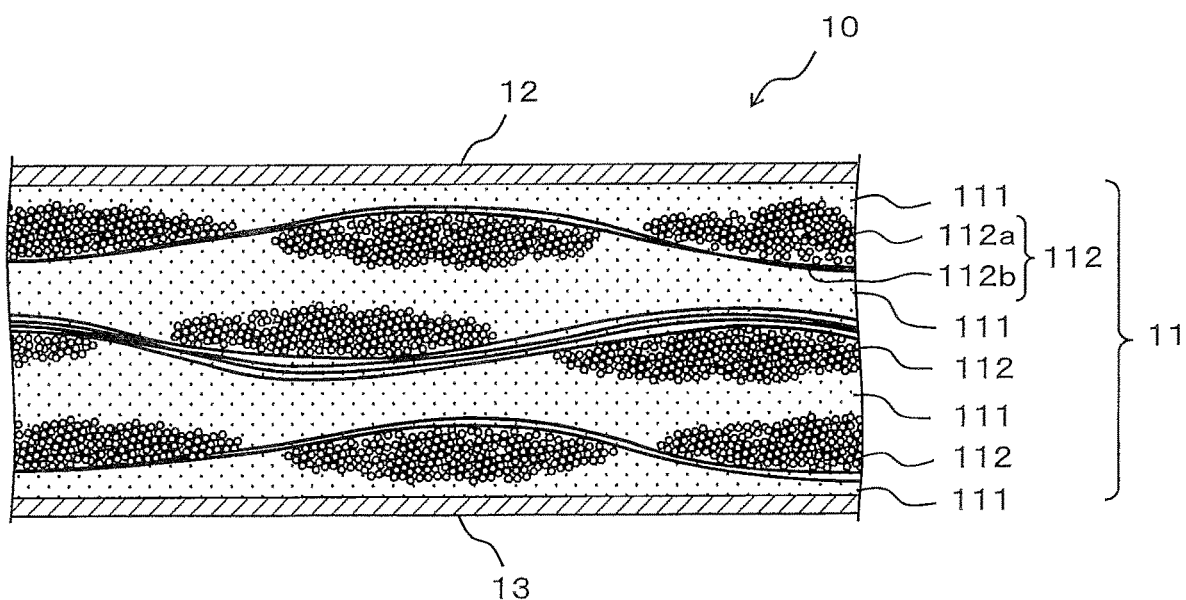
FIG. 2 is a cross-sectional view schematically illustrating the configuration of a base member of a laminate prepared in the method for manufacturing the printed board according to the embodiment.
Figure 3:
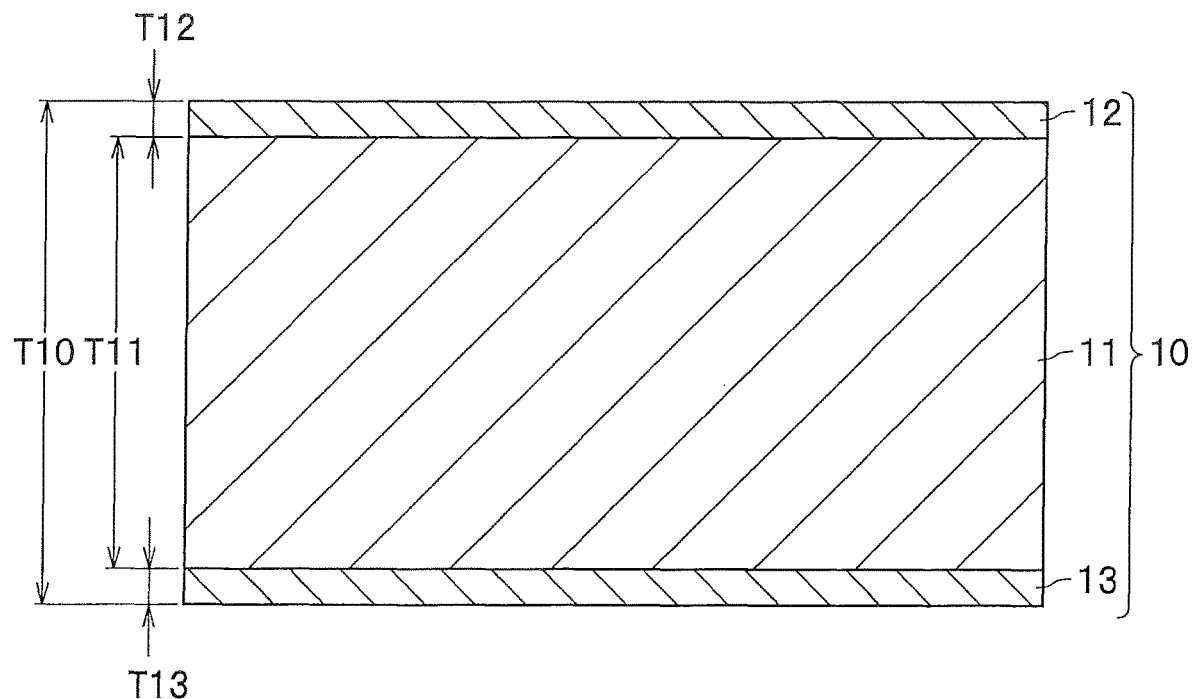
FIG. 3 is a cross-sectional view schematically illustrating the laminate prepared in the method for manufacturing the printed board according to the embodiment.
Figure 4:
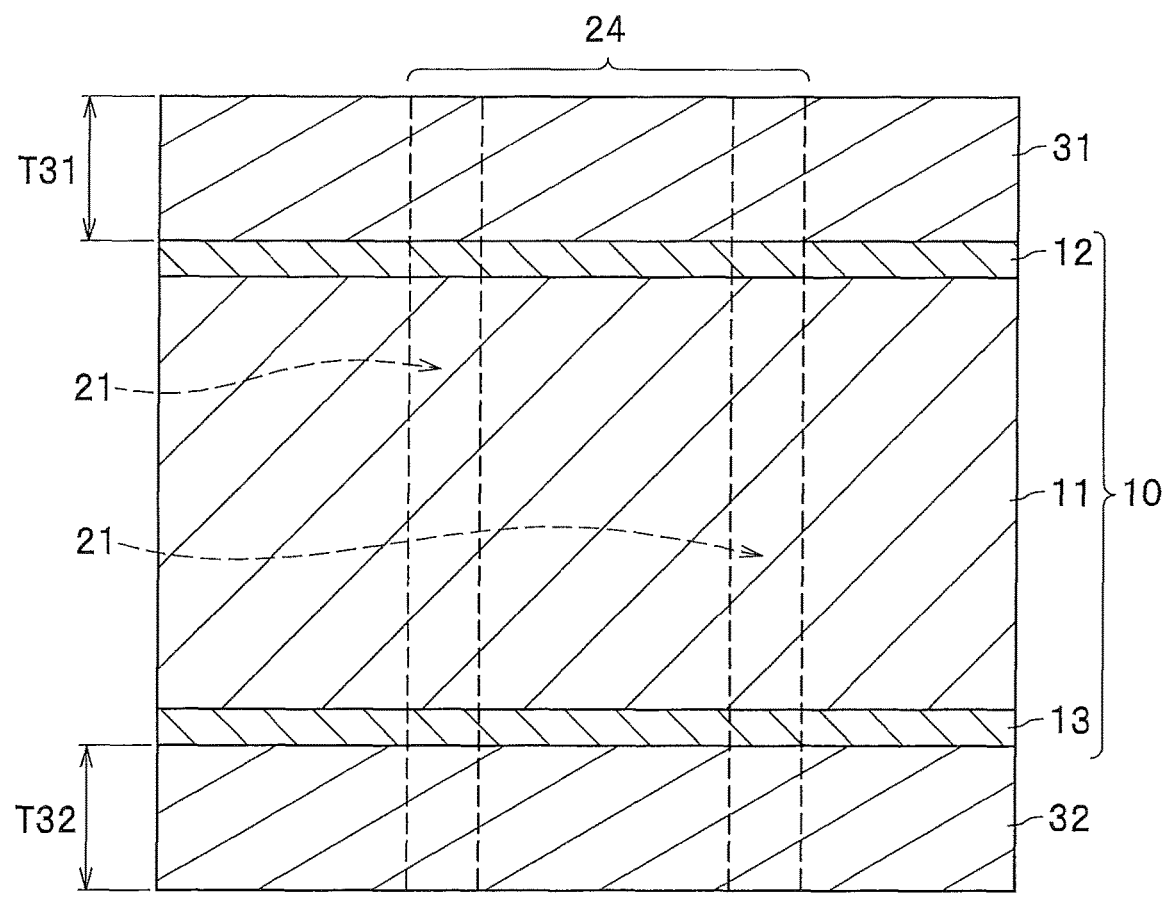
FIG. 4 is a cross-sectional view schematically illustrating the laminate with protective layers formed thereon in the method for manufacturing the printed board according to the embodiment.
Figure 5:
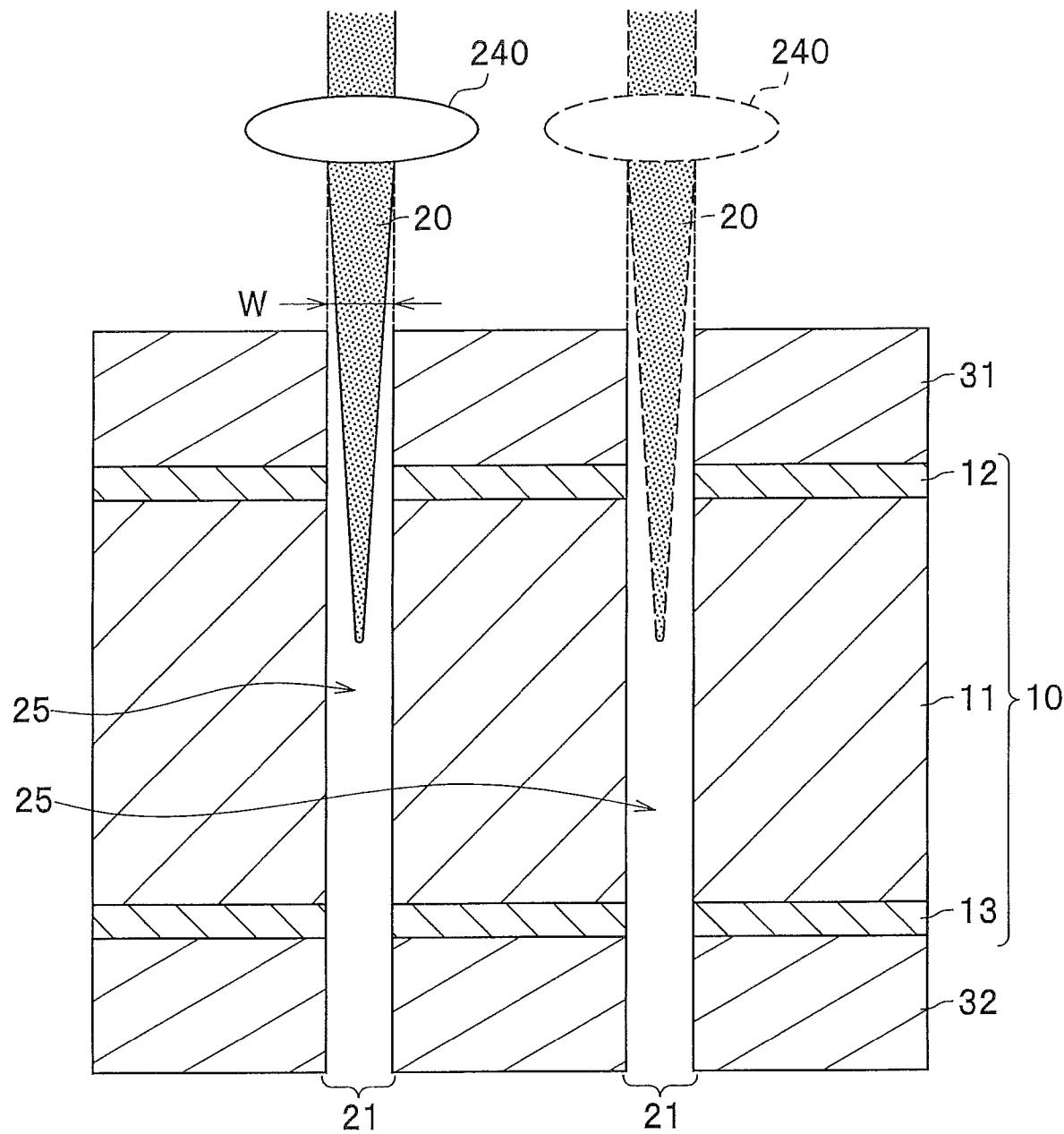
FIG. 5 is a cross-sectional view schematically illustrating the laminate with a laser beam irradiated thereto in the method for manufacturing the printed board according to the embodiment.
Figure 6:
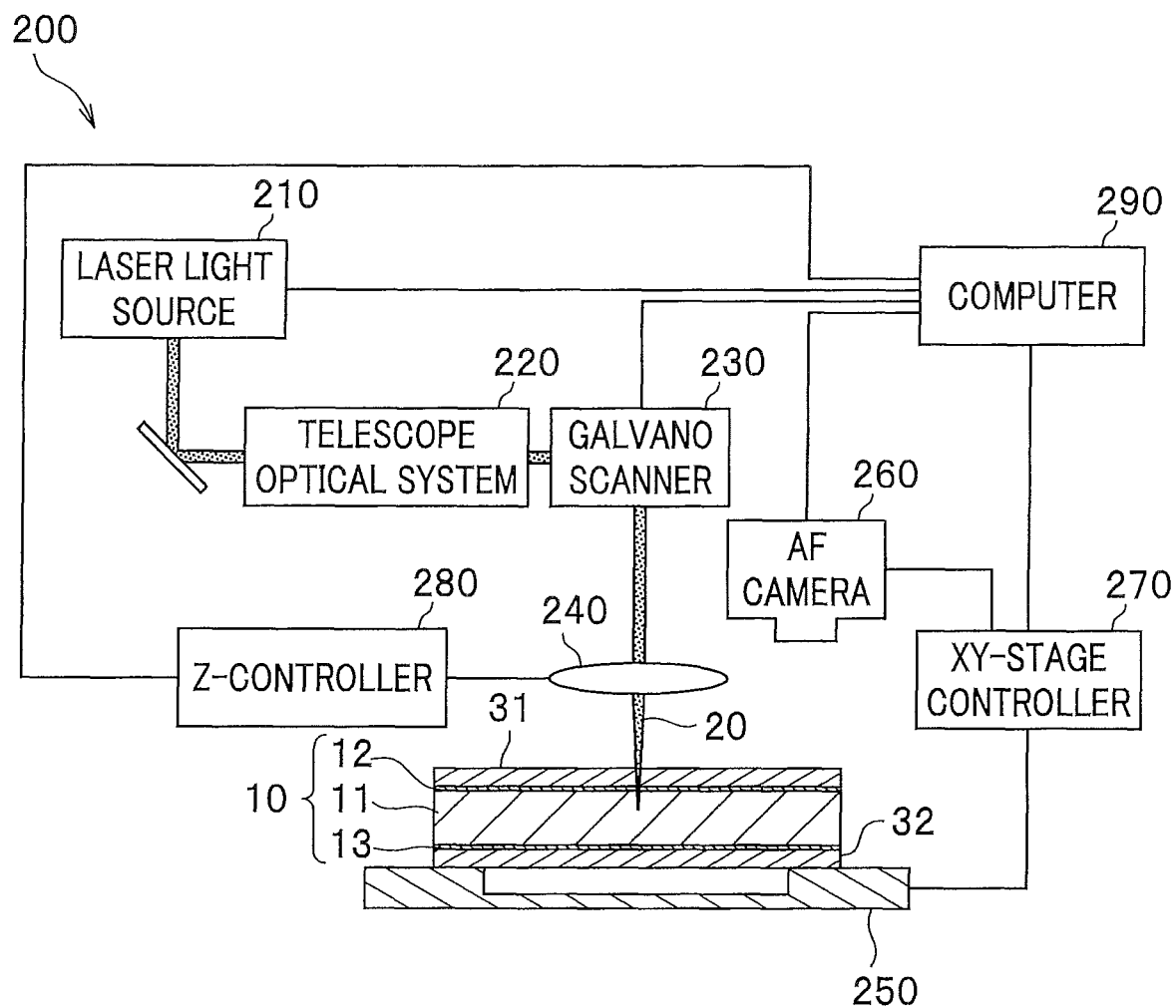
FIG. 6 is a schematic diagram illustrating an example of a laser machining apparatus used in the method for manufacturing the printed board according to the embodiment.
Figure 7:
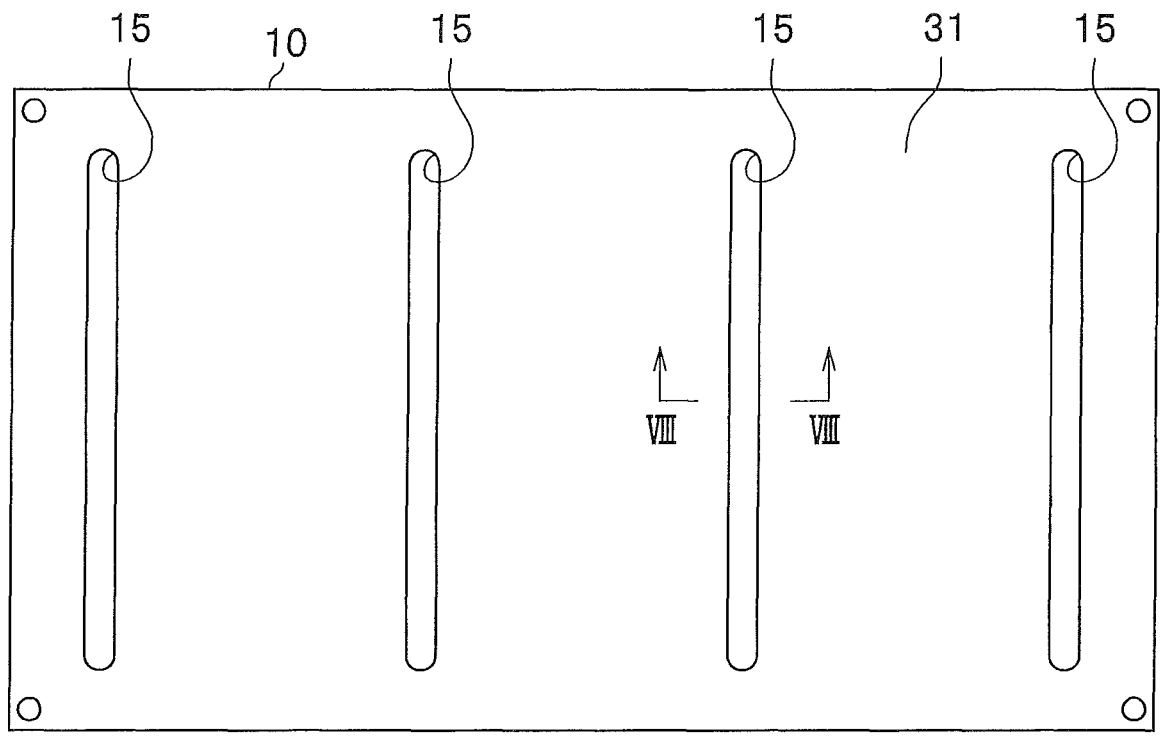
FIG. 7 is a plan view schematically illustrating the laminate with through-holes formed therethrough in the method for manufacturing the printed board according to the embodiment.
Figure 8:
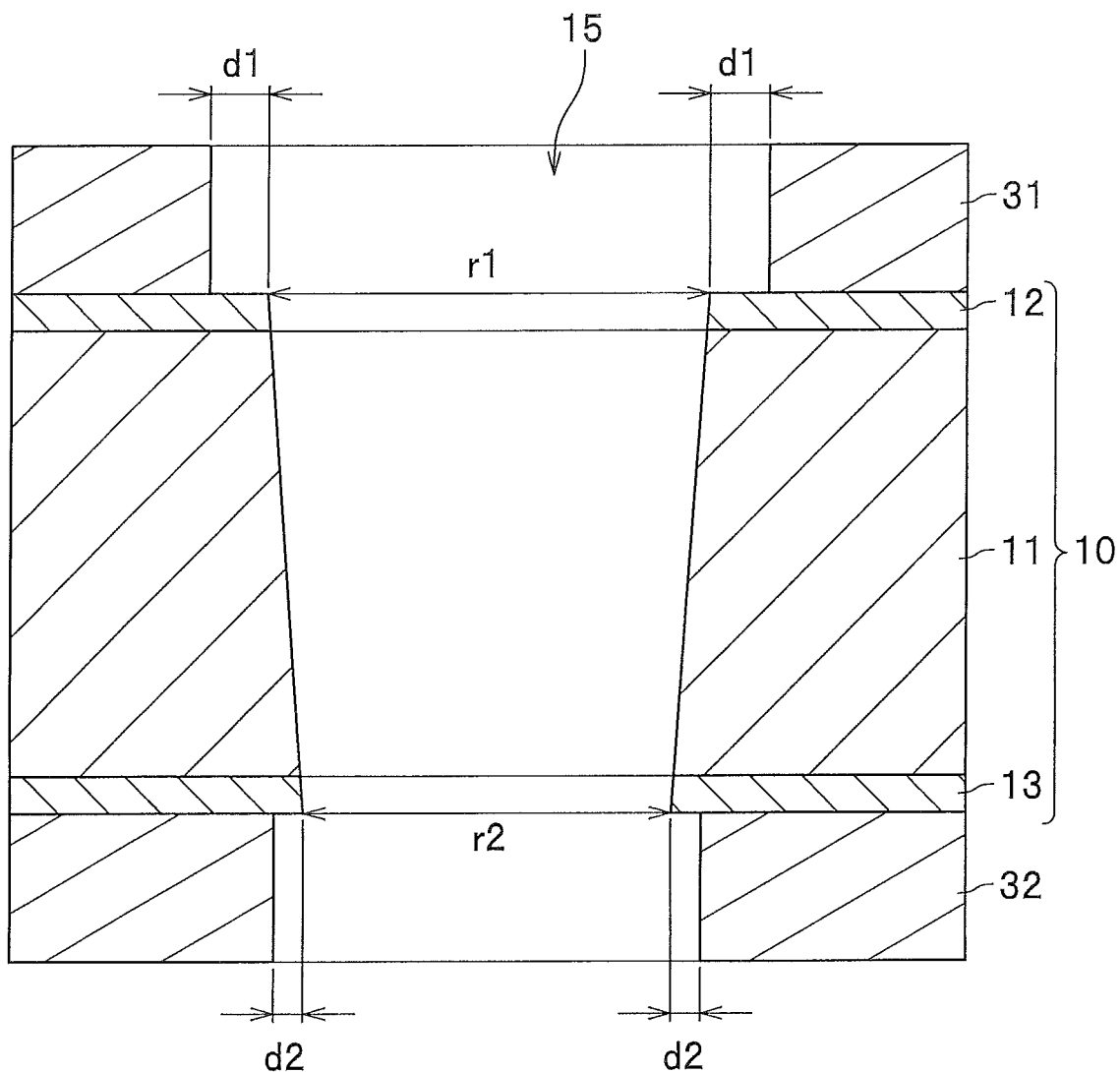
FIG. 8 is a cross-sectional view taken along line VIII-VIII in FIG. 7.
Figure 9A:
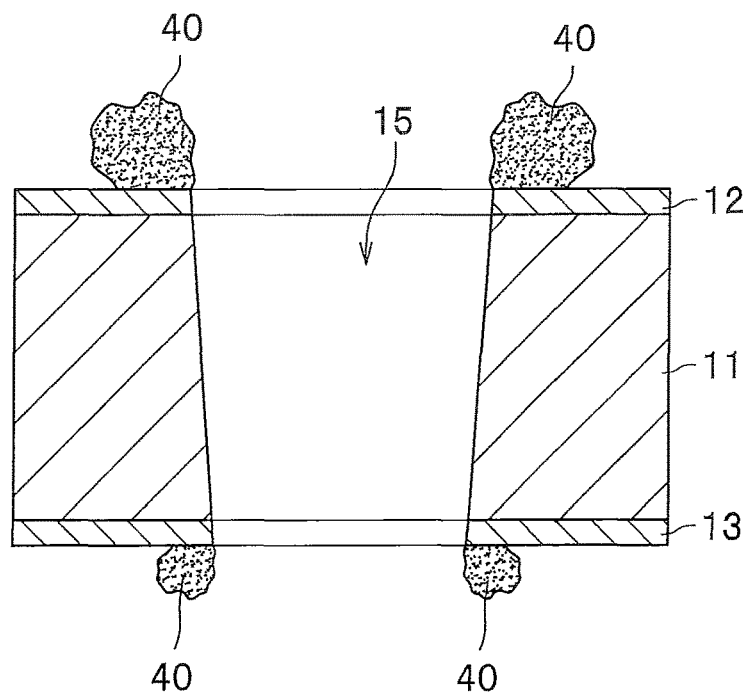
FIG. 9A is a cross-sectional view schematically illustrating the laminate with a through-hole formed therethrough in a conventional printed board manufacturing method.
Figure 9B:
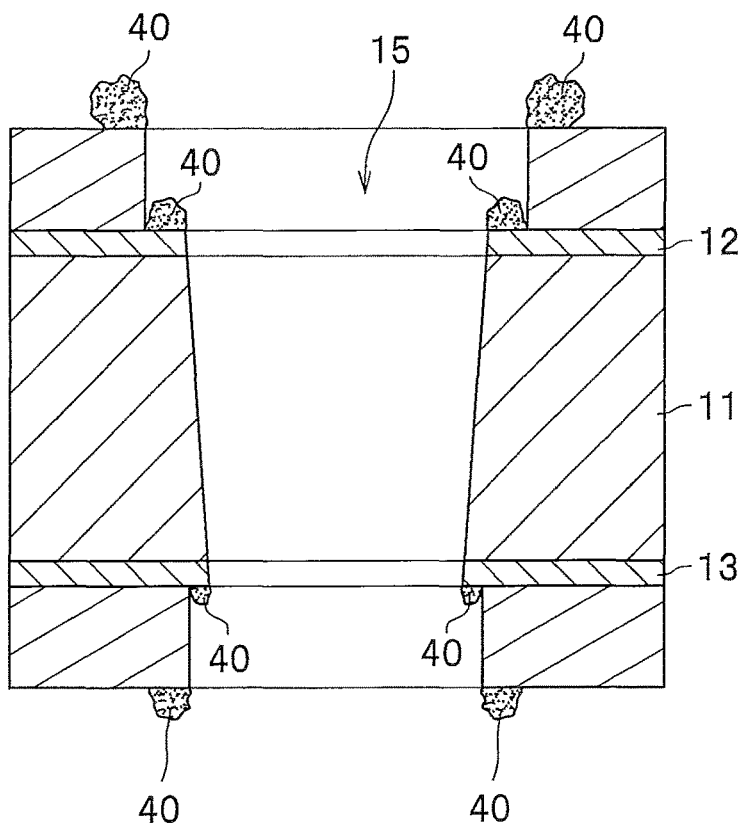
FIG. 9B is a cross-sectional view schematically illustrating the laminate with a through-hole formed therethrough in the method for manufacturing the printed board according to the embodiment.
Figure 10:
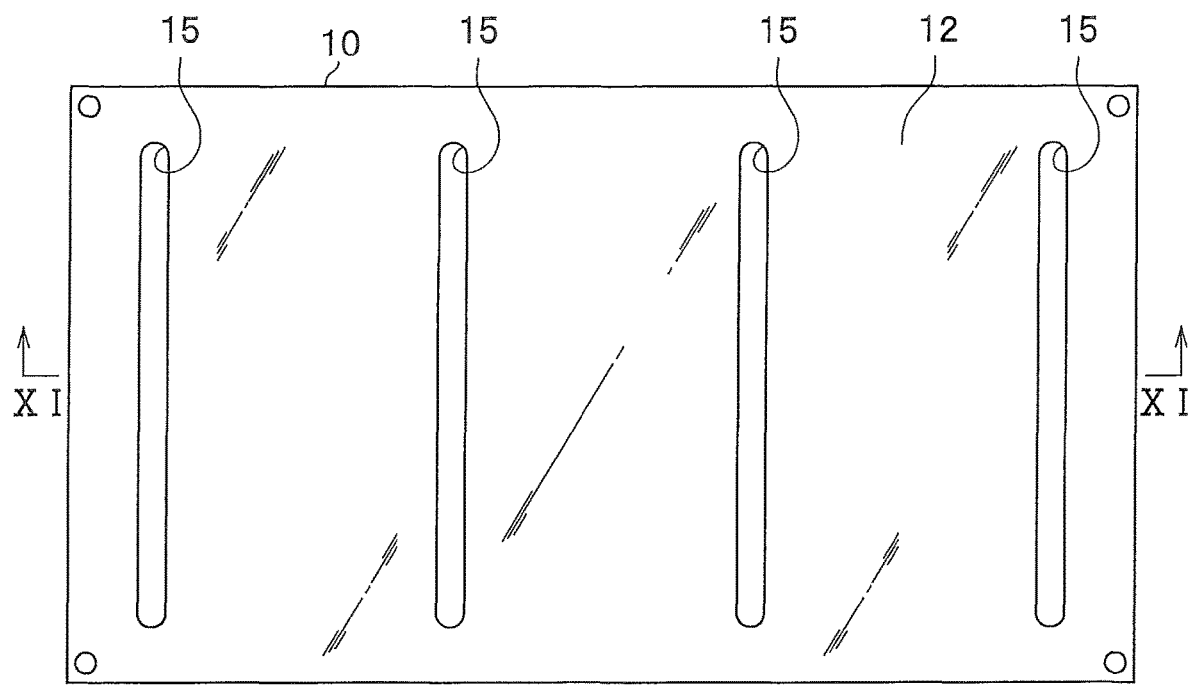
FIG. 10 is a plan view schematically illustrating the laminate with the protective layers removed in the method for manufacturing the printed board according to the embodiment.
Figure 11:
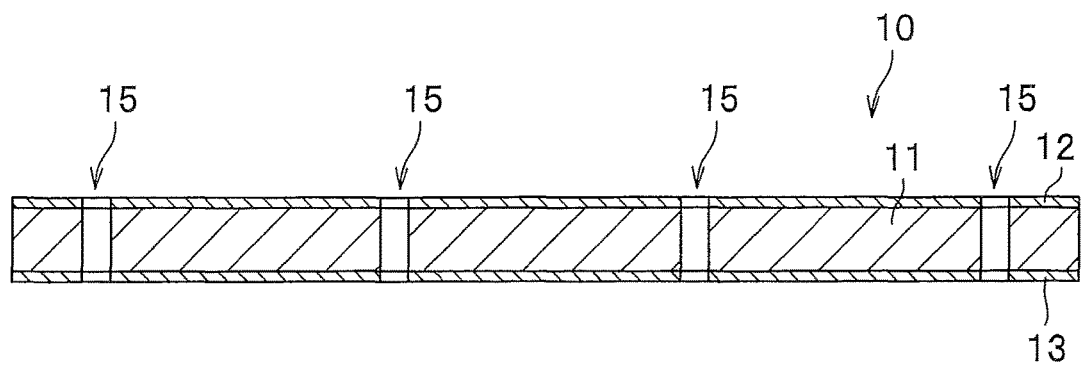
FIG. 11 is a cross-sectional view taken along line XI-XI in FIG. 10.
Figure 12A:
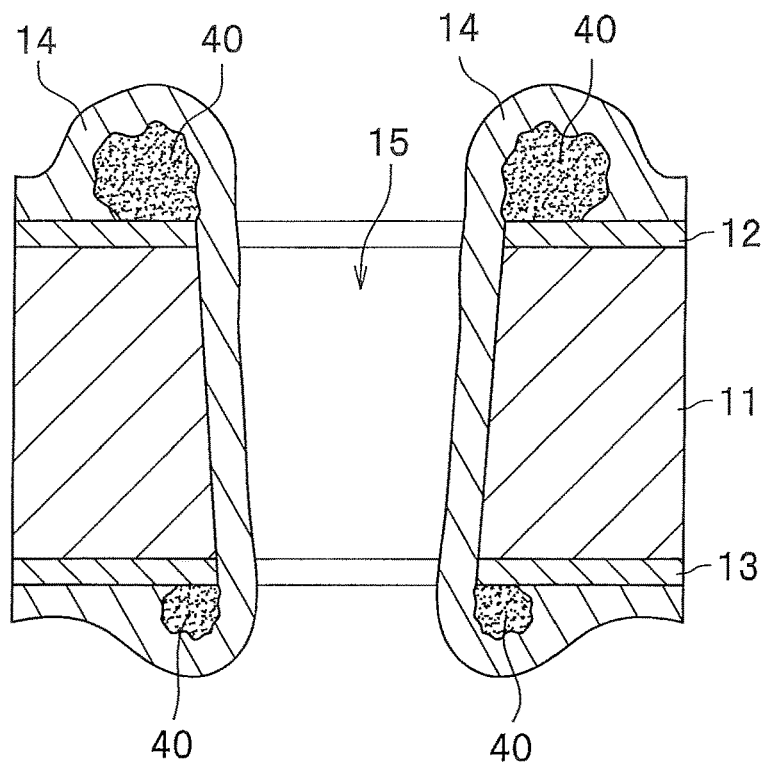
FIG. 12A is a cross-sectional view schematically illustrating the laminate plated in the conventional printed board manufacturing method.
Figure 12B:
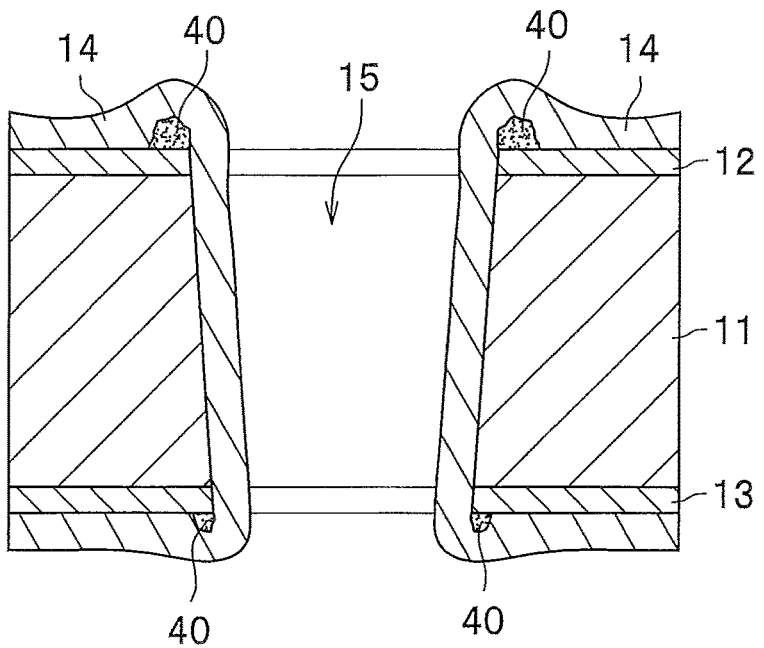
FIG. 12B is a cross-sectional view schematically illustrating the laminate plated in the method for manufacturing the printed board according to the embodiment.
Figure 13:
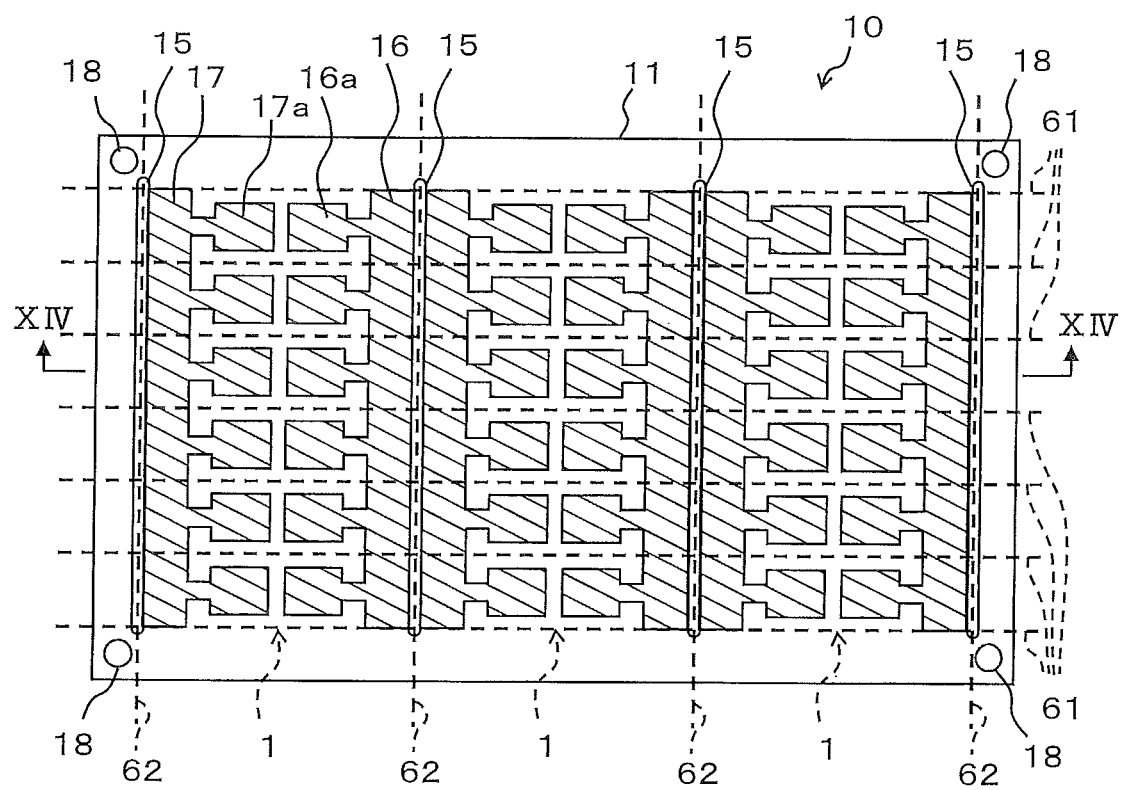
FIG. 13 is a plan view of a board with wiring patterns formed thereon in the method for manufacturing the printed board according to the embodiment.
Figure 14:
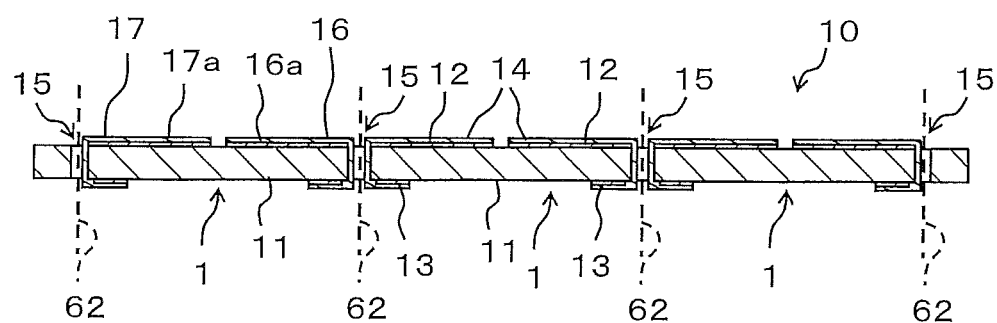
FIG. 14 is a cross-sectional view taken along line XIV-XIV in FIG. 13.

FIG. 1 is a flowchart illustrating the procedure of a method for manufacturing the printed board according to an embodiment. FIG. 2 is a cross-sectional view schematically illustrating the configuration of a base member of a laminate prepared in the method for manufacturing the printed board according to the embodiment. FIG. 3 is a cross-sectional view schematically illustrating the laminate prepared in the method for manufacturing the printed board according to the embodiment. FIG. 4 is a cross-sectional view schematically illustrating the laminate with protective layers formed thereon in the method for manufacturing the printed board according to the embodiment. FIG. 5 is a cross-sectional view schematically illustrating the laminate with a laser beam irradiated thereto in the method for manufacturing the printed board according to the embodiment. FIG. 6 is a schematic diagram illustrating an example of a laser machining apparatus used in the method for manufacturing the printed board according to the embodiment. FIG. 7 is a plan view schematically illustrating the laminate with through-holes formed therethrough in the method for manufacturing the printed board according to the embodiment. FIG. 8 is a cross-sectional view taken along line VIII-VIII in FIG. 7. FIG. 9A is a cross-sectional view schematically illustrating the laminate with a through-hole formed therethrough in a conventional printed board manufacturing method. FIG. 9B is a cross-sectional view schematically illustrating the laminate with a through-hole formed therethrough in the method for manufacturing the printed board according to the embodiment. FIG. 10 is a plan view schematically illustrating the laminate with the protective layers removed in the method for manufacturing the printed board according to the embodiment. FIG. 11 is a cross-sectional view taken along line XI-XI in FIG. 10. FIG. 12A is a cross-sectional view schematically illustrating the laminate plated in the conventional printed board manufacturing method. FIG. 12B is a cross-sectional view schematically illustrating the laminate plated in the method for manufacturing the printed board according to the embodiment. FIG. 13 is a plan view of a board with wiring patterns formed thereon in the method for manufacturing the printed board according to the embodiment. FIG. 14 is a cross-sectional view taken along line XIV-XIV in FIG. 13. Meanwhile, illustration of the detailed configuration of the base member is omitted in the cross-sectional views illustrated in FIG. 3 and subsequent figures. Also, in the plan view illustrated in FIG. 13, the regions where a first metal layer 12, a second metal layer 13, and a third metal layer 14 are left as wiring patterns are hatched for convenience.

The printed board manufacturing method includes a first step S1 (laminate preparing step), a second step S2 (protective-layer forming step), and a third step S3 (through-hole forming step). Here, the board manufacturing method further includes a fourth step S4 (protective-layer removing step), a fifth step S5 (plating step), and a sixth step S6 (wiring-pattern forming step) after the third step S3. Meanwhile, the printed board may be manufactured by distributing these steps among multiple manufacturers.

Note that the method for manufacturing the printed board according to the embodiment is a method of obtaining a printed board by forming a through-hole through a laminate containing glass cloths via lasing machining. Here, the laminate's physical properties, composition, and the like do not greatly differ before and after the laser machining. Also, the through-hole to be formed includes a dot-shaped through-hole that can be formed without scanning a laser beam and an opening that can be formed by scanning a laser beam. This opening includes a hole with substantially the same shape as a scanned line formed by scanning a laser beam in a straight and/or curved pattern, and a hole with substantially the same shape as a predetermined region formed by scanning a laser beam around this predetermined region.

Each step will now be described.

First Step

The first step S1 is a step of preparing a laminate 10 having a plate-shaped insulative base member 11, the first metal layer 12, which is attached to one surface of the base member 11, and the second metal layer 13, which is attached to the opposite surface of the base member 11. The laminate 10 may be a purchased commercially available product or manufactured. For example, the laminate 10 is, but not limited to, a rigid printed board.

The base member 11 is formed by alternately laminating multiple resin layers 111 and multiple layers of glass cloths 112 woven with warp threads 112$a$ and weft threads 112$b$. For the glass cloths 112, E-glass, made of $SiO_2$—$Al_2O_3$—$CaO$—$B_2O_3$, etc., S-glass, made of $SiO_2$—$Al_2O_3$—$MgO$, etc., or the like may be used, for example. The glass cloths 112 is impregnated with the resin making up the resin layers 111, so that the resin layers 111 and the glass cloths 112 integrally form a firm base member 11. The base member 11 preferably has at least three layers of glass cloths 112. This is because laminating multiple layers of glass cloths improves uneven distribution of the warp threads 112$a$ and the weft threads 112$b$ in the glass cloths and increases their evenness, thereby enabling the work surface to be evenly finished when worked by a laser.

The type of resin making up the resin layer 111 is not particularly limited. Examples of the resin making up the resin layer 111 include epoxy resin, polyimide resin, polyethylene terephthalate resin, polyethylene naphthalate resin, bismaleimide triazine resin, phenol resin, silicone resin, modified silicone resin, epoxy-modified silicone resin, polyphenylene ether resin, liquid crystal polymer resin, and combinations of these.

Also, the base member 11 may contain a reinforcing member for improving its strength as the glass cloths 112 in this embodiment or may contain no reinforcing member. The material of the reinforcing member can be glass fibers, ceramic fibers, carbon fibers, aramid fibers, or a combination of these. The faun of the reinforcing member can be woven fabric, non-woven fabric, paper, felt, or the like. Also, the reinforcing member may be dispersed as a filler in the resin layers 111.

The first metal layer 12 covers at least part of the one surface of the base member 11. More specifically, the first metal layer 12 covers at least a portion of the base member 11 where a through-hole is to be formed. The first metal layer 12 is made of one or more than one metal selected from Cu, Ag, Au, Ni, and Al or an alloy containing any of these metals as its main component. The first metal layer 12 can be twined by sputtering, vapor deposition, plating, or the like. A thickness T12 of the first metal layer 12 is not particularly limited and is at least 1 micrometer (μm) and at most 18 μm, for example. The first metal layer 12 includes thin layers such as a metal foil.

The second metal layer 13 is made of a material similar to that of the first metal layer 12. The second metal layer 13 covers at least part of the opposite surface of the base member 11. A thickness T13 of the second metal layer 13 is not particularly limited and is at least 1 μm and at most 18 μm, for example.

A copper-clad laminate with a base member 11 made of glass epoxy and copper foils formed on both surfaces thereof may be used as the laminate 10. A thickness T10 of the laminate 10 is the sum of a thickness T11 of the base member 11, the thickness T12 of the first metal layer 12, and the thickness T13 of the second metal layer 13. The thickness T11 of the base member 11 is not particularly limited and is at least 200 μm and at most 500 μm, for example.

Second Step

The second step S2 is a step of forming protective layers 31, 32 on the first metal layer 12 and the second metal layer 13 respectively. The protective layers 31, 32 are removable from the top of the first metal layer 12 and the second metal layer 13 with a predetermined solvent. The protective layers 31, 32 are preferably formed of a dry film made of a resin selected from acrylic resin, epoxy-based resin, and urethane-based resin, for example.

A thickness T31 of the protective layer 31 and a thickness T32 of the protective layer 32 are not particularly limited and are at least 15 μm and at most 75 μm, for example.

The material of the protective layers 31, 32 is preferably the same as the material to be used as an etching mask in the sixth step S6 (wiring-pattern forming step). Typically, in manufacture lines of printed boards, a DFR (Dry Film photo Resist), which has a photosensitive layer in a sheet form, for example, is used as an etching mask for forming wiring patterns. The DFR is detached with an alkaline solution after being exposed to light, developed, and used as an etching mask. Examples of the alkaline solution used for the detachment include sodium hydroxide aqueous solution and potassium hydroxide aqueous solution. Thus, in this embodiment, a DFR is exemplarily attached to each of the upper surface and the lower surface of the laminate 10.

Meanwhile, in FIG. 4, reference sign 24 indicates opening formation areas being areas where openings are to be formed. Also, reference sign 21 indicates a laser-beam irradiation areas. The laser-beam irradiation areas 21 are defined annularly at the edge of the opening formation areas 24. Note that the edge of the opening formation areas 24 will be the edge of the openings.

Third Step

The third step S3 is a step of irradiating the laminate 10 on which the protective layers 31, 32 are formed with a laser beam 20 from the first metal layer 12 side to thereby form an opening 15 (through-hole: see FIG. 7) penetrating in the thickness direction of the laminate 10. In this embodiment, as the opening 15, multiple elongated holes parallel to each other in a plan view are formed.

An example of a laser machining apparatus used in the third step S3 will be described first.

Configuration of Laser Machining Apparatus

A laser machining apparatus 200 includes a laser light source 210, a telescope optical system 220, a galvano scanner 230, an fθ lens 240, a stage 250, an AF camera 260, an XY-stage controller 270, a Z-controller 280, and a computer 290.

The laser light source 210 emits a laser beam 20 of a predetermined oscillation wavelength. The type of laser used as the laser light source 210 is appropriately selected in accordance with the type of laminate 10 and the like.

The telescope optical system 220 optimizes the beam diameter of the laser beam 20 emitted from the laser light source 210 in order to obtain a preferred work shape.

The galvano scanner 230 changes the direction of travel of the laser beam 20 optimized by the telescope optical system 220 based on an instruction from the computer 290. The laser beam 20 with its direction of travel controlled by the galvano scanner 230 is focused on the inside of the laminate 10 by the fθ lens 240. Combining the galvano scanner 230 and the fθ lens 240 in this manner allows a focal point of the laser beam 20 to be scanned at a constant speed along the laser-beam irradiation areas 21.

The stage 250 includes a placement table on which to place the laminate 10 and a drive mechanism which is capable of moving this placement table. The drive mechanism is capable of moving the placement table in the X-axis direction and the Y-axis direction and turning the placement table about the X axis and the Y axis. The laminate 10 on the stage 250 is moved in the X-axis direction and the Y-axis direction by this drive mechanism.

The AF (Autofocus) camera 260 is a camera that acquires the surface profile of a machining portion of the laminate 10. The acquired profile is output to the computer 290.

Based on an instruction from the computer 290, the XY-stage controller 270 moves the stage 250 in the X-axis direction and the Y-axis direction to position the focal point of the laser beam 20 at the laser-beam irradiation areas 21.

Based on an instruction from the computer 290, the Z-controller 280 moves the fθ lens 240 in the Z-axis direction to position the focal point of the laser beam 20 to the inside of the base member 11 of the laminate 10.

The computer 290 is connected to the laser light source 210, the galvano scanner 230, the AF camera 260, the XY-stage controller 270, and the Z-controller 280 and comprehensively controls these components. For example, the computer 290 controls the AF camera 260 and the XY-stage controller 270 to acquire the surface profile of the laminate 10. Also, the computer 290 controls the galvano scanner 230 and the Z-controller 280 such that the laser beam 20 is scanned to circle along the laser-beam irradiation areas 21 multiple times. Also, the computer 290 controls the XY-stage controller 270 to move the stage 250 such that the laser beam 20 can be applied to the laser-beam irradiation areas 21.

Detailed Procedure of Third Step S3

First, the laminate 10 on which the protective layers 31, 32 are formed is placed on the placement table of the stage 250 with the protective layer 31 side (first metal layer 12 side) up. Then, the surface profile of the laminate 10 is acquired by the AF camera 260 and the XY-stage controller 270.

Thereafter, the laminate 10 is moved to a predetermined position by the XY-stage controller 270 and the laser beam 20 is emitted from the laser light source 210, so that the laser beam 20 is applied to the laminate 10 from above the protective layer 31. In doing so, the direction of travel of the laser beam 20 is changed by the galvano scanner 230 to apply the laser beam 20 such that it is scanned annularly along the laser-beam irradiation areas 21.

As illustrated in FIG. 5, the focal point of the laser beam 20 is positioned to the inside of the base member 11 of the laminate 10. The laser beam 20 is then scanned to circle along the laser-beam irradiation areas 21 multiple times. For example, the laser beam 20 is scanned to circle about 60 times in a case where the laminate 10 is a glass epoxy board in which copper foils each with a thickness of several μm are provided as the first metal layer 12 and the second metal layer 13 and the thickness of the base member 11 is several hundred Consequently, a through-groove 25 can be formed annularly in a plan view which has a depth equal to the thickness of the laminate 10 on which the protective layers 31, 32 are formed.

Meanwhile, the laser beam 20 is repetitively applied such that an interval between irradiation cycles of the laser beam 20 at the same point on the laminate 10 in a plan view is at least 5 milliseconds (ms). In this way, excessive thermal energy accumulated in the base member 11 of the laminate 10 can be effectively dissipated to the first metal layer 12 and the second metal layer 13 during the application intervals. It is therefore possible to suppress the occurrence of thermal damage in the machining portion of the base member 11.

In the case of forming multiple openings 15 in the laminate 10, the laminate 10 may be moved by the XY-stage controller 270 and then the above mentioned steps may be repeated. Finally, the portion separated by the through-groove 25 is removed. As a result, the opening 15 is formed.

While the conditions of the laser machining are not particularly limited as long as they are capable of properly forming the through-groove 25 in the laminate 10, the following conditions are preferred.

In view of reducing undesirable thermal damaging of the machining portion of the base member 11, the oscillation wavelength of the laser beam 20 is preferably at least 250 nanometer (nm) and at most 2000 nm and more preferably at least 250 nm and at most 1500 nm. For example, the oscillation wavelength of the laser beam 20 is 355 nm.

In view of increasing the machining speed, the output of the laser beam 20 (laser power) is preferably at least 10 watt (W) and at most 60 W.

The laser beam 20 is pulsed light. In view of improving the processing quality, the pulse width of the laser beam 20 is preferably at least 10 picoseconds (ps) and at most 100 nanoseconds (ns).

In view of improving the processing quality, the repetition frequency of the laser beam 20 is preferably at least 100 kilohertz (kHz) and at most 3000 kHz and more preferably at least 1 megahertz (MHz) and at most 3 MHz.

In view of increasing the machining speed, the pulse energy of the laser beam 20 is preferably at least 3 microjoule ($\mu$J) in a case where the wavelength of the laser beam 20 is 355 nm, for example.

In view of increasing the machining speed, the fluence of the laser beam 20 at the surface of the laminate 10 is preferably at least 3 J/cm$^2$ and the fluence of the laser beam 20 at its focal point is preferably at least 10 J/cm$^2$ in the case where the wavelength of the laser beam 20 is 355 nm. Here, the surface of the laminate 10 refers to the surface of the first metal layer 12.

In view of reducing the pitch of the laser machining, a beam diameter W (see FIG. 5) as the width of the laser beam 20 is preferably at least 10 $\mu$m and at most 30 $\mu$m.

The scan speed of the laser beam 20 is not particularly limited. However, in view of increasing the machining speed, the scan speed is preferably at least 1000 mm/sec and at most 3000 mm/sec.

Details of Opening Formed in Third Step

Details of each opening 15, formed in the laminate 10, will now be described.

In the third step S3, as mentioned earlier, the laser beam 20 is applied to the laminate 10 on which the protective layers 31, 32 are formed from the protective layer 31 side (first metal layer 12 side). Thus, in a plan view of the opening 15, a minor radius r1 of the elongated hole (opening 15) on the first metal layer 12 side is greater than a minor radius r2 of the elongated hole on the second metal layer 13 side. Nonetheless, the difference between the minor radius r1 of the elongated hole and the minor radius r2 of the elongated hole is 20 $\mu$m or less since the laser beam 20 is applied substantially perpendicularly to the laminate 10.

The protective layers 31, 32, formed on the laminate 10, thermally contract due to the laser machining Thus, the edges in the protective layers 31, 32 are slightly separated away from the edge of the opening 15. The application of the laser beam 20 from the first metal layer 12 side makes a thermal contraction width d1 on the first metal layer 12 side greater than a thermal contraction width d2 on the second metal layer 13 side. According to observations with a scanning electron microscope (SEM) in laser machining tests conducted under a predetermined condition, the thermal contraction width d1 on the first metal layer 12 side was about 10 $\mu$m, for example, and the thermal contraction width d2 on the second metal layer 13 was less than or equal to half of the thermal contraction width d1.

Note that the application of the laser beam to the laminate 10 to form the opening 15 produces decomposed matters such as resin and molten glass (board materials). In the case of a conventional manufacturing method, decomposed matters 40 adhere to the surfaces of the first metal layer 12 and the second metal layer 13 and adversely affect subsequent steps, thus lowering the quality of the printed board. In particular, if molten glass adheres, it will be difficult to detach it. Also, the application of the laser beam 20 from the first metal layer 12 side results in adhesion of more decomposed matters 40 on the first metal layer 12 side than on the second metal layer 13 side. Such decomposed matters 40 can scatter not only to the vicinity of the peripheries of the opening 15 but also to points far from the opening 15.

In the case of the method for manufacturing the printed board according to the embodiment, the decomposed matters 40 adhere to the surfaces of the protective layers 31, 32 and can be easily removed along with the protective layers 31, 32 in a subsequent step. Note that decomposed matters 40 adhere to the regions on the surfaces of the first metal layer 12 and the second metal layer 13 from which the protective layers 31, 32 have been separated due to the thermal contraction. Nonetheless, the sizes of the decomposed matters 40 are limited by the thermal contraction width d1 on the first metal layer 12 side and therefore reduced to about ¼ of those in the conventional manufacturing method. Also, the regions where the protective layers 31, 32 have been separated are only the vicinity of the peripheries of the opening 15. Hence, those decomposed matters 40 scattered to points far from the opening 15 can be easily removed along with the protective layers 31, 32.

This embodiment has been described such that the laser beam 20 is applied to the laminate 10 from the first metal layer 12 side on the assumption that a light emitting device, for example, is to be placed on the first metal layer 12 side of the printed board being a finished product. Note, however, that the laser may be applied from the second metal layer 13 side based on this assumption.

Fourth Step

The fourth step S4 is a step of removing the protective layers 31, 32 with a predetermined solvent after the third step S3. The protective layers 31, 32 can be easily dissolved with an alkaline solution in the case of using a DFR as the material of the protective layers 31, 32.

Fifth Step

The fifth step S5 is a step of forming the third metal layer 14 by plating after the fourth step S4. The third metal layer 14 is a plated film continuously covering the first metal layer 12, the second metal layer 13, and the inner side surface of each opening 15. By forming the third metal layer 14, the first metal layer 12, which will be a wiring pattern on the upper side of the printed board, and the second metal layer 13, which will be a wiring pattern on the lower side of the printed board, can be electrically connected to each other through the opening 15.

While a different type of metal from the first metal layer 12 and the second metal layer 13 may be used for the third metal layer 14, the same metal is preferably used. For example, in a case of using Cu or a Cu alloy for the first metal layer 12 and the second metal layer 13, the third metal layer 14 is preferably formed by performing Cu plating. Using the same type of metal as the first metal layer 12 and the second metal layer 13 for the third metal layer 14 can enhance the bondability between these metal layers.

If decomposed matters 40 produced by the laser machining in the third step remain adhering to and contaminating the surfaces of the first metal layer 12 and the second metal layer 13, the third metal layer 14 is formed along the decomposed matters 40. Here, in the case of the conventional manufacturing method, large decomposed matters 40 measuring 40 μm or greater, for example, are remaining. Accordingly, the plated film, or the third metal layer 14, is deformed in such a pointed shape as to rise and bulge in the vicinity of the peripheries of each opening 15. This will cause a trouble in a step of mounting a light emitting device or the like to the finished printed board, for example. Note that decomposed matters 40 can scatter not only to the vicinity of the peripheries of the opening 15 but also to points far from the opening 15.

On the other hand, in the case of the method for manufacturing the printed board according to the embodiment, most decomposed matters 40 are removed along with the protective layers 31, 32 in the fourth step. As illustrated in FIG. 12B, few decomposed matters 40 remaining in the vicinity of the peripheries of each opening 15 only measure about 10 μm, for example, on the first metal layer 12 side, and the deformation of the third metal layer 14 is less intense than that in the conventional manufacturing method. This allows manufacturing of a high-quality printed board that will not cause a trouble in the step of mounting a light emitting device or the like to the finished printed board, for example.

Note that while the description has been predetermined such that a light emitting device is to be placed on the first metal layer 12 side of the printed board being a finished product, the light emitting device may be placed on the second metal layer 13 side. With the light emitting device thus mounted, light from the light emitting device will not be obstructed by the decomposed matters 40 since the decomposed matters 40 formed on the second metal layer 13 side are smaller in size than those on the first metal layer 12 side.

Sixth Step

The sixth step S6 is a step of forming wiring patterns by etching the first metal layer 12, the second metal layer 13, and the third metal layer 14. The sixth step S6 includes an etching-mask forming step S61, an exposing-developing step S62, an etching step S63, and an etching-mask detaching step S64.

In the etching-mask forming step S61, on the surfaces of each opening 15 and the laminate 10 on which the third metal layer 14 are formed, an etching mask (resist) is formed which protects regions to be left as wiring electrodes. Specifically, a DFR, for example, is attached to each of the upper surface and the lower surface of the laminate 10.

In the exposing-developing step S62, the DFR is exposed to light with a photomask placed thereon on which a circuit pattern is depicted. Then, with an alkaline solution, the exposed portion of the photosensitive layer is developed whereas the unexposed portion of the photosensitive layer is removed. The portion of the photosensitive layer cured by the exposure functions as a resist.

In the etching step S63, the portion of the first metal layer 12, the second metal layer 13, and the third metal layer 14, that are exposed to the outside through the resist (DFR) are removed with an etching solution that works on the type(s) of metal used as the first metal layer 12, the second metal layer 13, and the third metal layer 14.

In the etching-mask detaching step S64, the resist (DFR) is dissolved with an alkaline solution, thereby forming wiring patterns.

A laminate 10 illustrated in FIG. 13 is configured to allow manufacturing of a collective board including six printed boards 1 in the vertical direction and three printed boards 1 in the horizontal direction in a matrix. In FIG. 13, the regions of the individual printed boards 1 are illustrated by defining them with boundary lines 61 and boundary lines 62. Also, in the laminate 10, openings 15 penetrating in a thickness direction of the laminate 10 are formed along the boundary lines 62, so that the printed boards 1 are already separated in the horizontal direction. A pair of wiring electrodes 16, 17 are provided for each individual printed board 1 in such a way as to extend from the upper surface of the laminate 10 to its lower surface through some openings 15. In a case of flip-chip mounting a light emitting device, for example, to a printed board 1, a connection portion 16a of the wiring electrode 16 is joined to one electrode of the light emitting device and a connection portion 17a of the wiring electrode 17 is joined to the opposite electrode of the light emitting device by using an electrically conductive bonding material such as solder.

The printed boards 1 are separated into individual pieces by cutting the laminate 10 along the boundary lines 61. Here, no cutting operation is needed along the boundary line 62 since the printed boards 1 are separated from the printed boards 1 adjacent thereto in the horizontal direction by the openings 15, which are provided along the boundary lines 62. Meanwhile, through-holes 18 in the four corners can be used as marks for recognizing the position of the laminate 10.

As described above, with the method of manufacturing the printed board according to the embodiment, decomposed matters produced by laser machining can be prevented from adhering to the surfaces of the printed board. Moreover, deformation and damaging of the printed board can be reduced since the protective layers 31, 32 can be easily removed from the first metal layer 12 and the second metal layer 13 at the surfaces of the laminate 10.

While the method of manufacturing the printed board has been specifically described above through an embodiment of the present disclosure, the scope of the present invention is not limited to this description but shall be widely interpreted based on the recitations in the claims. Moreover, it is clear that various kinds of changes and modifications of the preset invention based on these recitations are included in the scope of the present invention.

For example, the material of the protective layers 31, 32 is not limited to a DFR as long as it is removable from the top of the first metal layer 12 and the second metal layer 13 with a predetermined solvent in a subsequent step. For example, in a case where a printed resist obtained by printing and thermally curing paste is used as the etching mask in the sixth step S6 (wiring-pattern forming step), the material of the protective layers 31, 32 may be the printed resist. Alternatively, the material of the protective layers 31, 32 may be different from the material used as the etching mask. Further, the solvent for removing the protective layers 31, 32 may be one that dissolves the protective layers or one that detaches the protective layers by separating them. Also, a neutral solvent such as water or an organic solvent may be used depending on the material of the protective layers 31, 32.

The wiring patterns are not limited to the shapes illustrated in FIG. 13 and FIG. 14 but can be formed according to the purpose. For example, the wiring patterns may be formed in such a way as to make circuitry assuming the mounting of a protective device besides a light emitting device. Moreover, the laminate 10 is not limited to one as illustrated in FIG. 13 and FIG. 14 for manufacturing a collection of printed boards 1 for a light emitting device but may be one for manufacturing a single printed board 1.

The shape of each opening 15, formed in the laminate 10, is not limited to the shape illustrated in FIG. 7. The shape of the opening 15 in a plan view may be a circular, elliptical, rectangular, or long circular shape or a more complicated shape.

What is claimed is:

1. A method of manufacturing a printed board, the method comprising:
    preparing a laminate having a base member in which a plurality of layers of glass cloths and a plurality of resin layers are alternately laminated, a first metal layer attached to one surface of the base member, and a second metal layer attached to an opposite surface of the base member;
    forming a protective layer on each of the first metal layer and the second metal layer after preparing the laminate;
    forming a through-hole penetrating in a thickness direction of the laminate by irradiating the laminate on which the protective layer is formed with a laser beam after forming the protective layer;
    removing the protective layer with a solvent after forming the through-hole; and
    forming a third metal layer by plating after removing the protective layer,
    wherein the protective layer is formed of a dry film made of a resin selected from acrylic resin, epoxy-based resin, and urethane-based resin,
    wherein the protective layer has a thickness of at least 15 micrometer ($\mu$m) and at most 75 micrometer ($\mu$m),
    wherein the base member has at least three layers of glass cloths,
    wherein the base member has a thickness of at least 200 micrometer ($\mu$m) and at most 500 micrometer ($\mu$m),
    wherein, in forming the through-hole, the protective layer on the first metal layer thermally contracts such that decomposed matter is formed on an exposed portion of the first metal layer,
    wherein the third metal layer continuously covers the first metal layer, the decomposed matter on the first metal layer, the second metal layer, and an inner side surface of the through-hole, and
    wherein, in forming the through-hole, a width of the through-hole is at least 10 micrometer ($\mu$m) and at most 30 micrometer ($\mu$m).

2. The method of manufacturing a printed board according to claim 1,
    wherein, in forming the through-hole, the laminate on which the protective layer is formed is irradiated with the laser beam so as to circularly scan along an outer edge of an opening as the through-hole.

3. The method of manufacturing a printed board according to claim 1,
    wherein, in forming the through-hole, as an opening, a plurality of elongated holes parallel to each other in a plan view are formed.

4. The method of manufacturing a printed board according to claim 3,
    wherein, in forming the through-hole, the laser beam is applied from the first metal layer side such that in the plan view, a minor radius of the elongated hole on a side of the first metal layer is greater than a minor radius of the elongated hole on a side of the second metal layer, and that the difference between the minor radiuses is at most 20 micrometer ($\mu$m).

5. The method of manufacturing a printed board according to claim 1,
    wherein, in removing the protective layer, the protective layer is removed with an alkaline solution as the solvent.

6. The method of manufacturing a printed board according to claim 1, further comprising:
    forming wiring patterns by etching the first metal layer, the second metal layer, and the third metal layer after forming the third metal layer, and
    wherein a material of the protective layer is the same as the material to be used as an etching mask in forming wiring patterns.

7. The method of manufacturing a printed board according to claim 1,
    wherein, in forming the through-hole, an oscillation wavelength of the laser beam is at least 250 nanometer (nm) and at most 2000 nanometer (nm).

8. The method of manufacturing a printed board according to claim 1,
    wherein, in forming the through-hole,
    a laser power is at least 10 W and at most 60 W;
    a repetition frequency of the laser beam is at least 100 kHz and at most 3000 kHz, and
    a scan speed of the laser beam is at least 1000 mm/sec and at most 3000 mm/sec.

9. The method of manufacturing a printed board according to claim 1,
    wherein, in forming the through-hole,
    a focal point of the laser beam is positioned to an inside of the base member of the laminate;
    a wavelength of the laser beam is 355 nanometer (nm);
    a pulse energy of the laser beam is at least 3 microjoule ($\mu$J);
    a fluence of the laser beam on a surface of the laminate is at least 3 J/cm$^2$;
    a fluence of the laser beam at the focal point is at least 10 J/cm$^2$;
    an interval between irradiation cycles of the laser beam at the same point on the laminate in a plan view is at least 5 milliseconds (ms).

10. The method of manufacturing a printed board according to claim 1,
    wherein, a pulse width of the laser beam is at least 10 picoseconds (ps) and at most 100 nanoseconds (ns).

11. The method of manufacturing a printed board according to claim 1,
    wherein, in forming the through-hole, a width of the laser beam is at least 10 micrometer ($\mu$m) and at most 30 micrometer ($\mu$m).

12. The method of manufacturing a printed board according to claim 1,
wherein the first metal layer has a thickness of at least 1 micrometer (μm) and most 18 micrometer (μm), and wherein the first metal layer is made of one or more than one metal selected from Cu, Ag, Au, Ni, and Al or an alloy containing any of these metals as its main component.

13. The method of manufacturing a printed board according to claim 1,
wherein the second metal layer has a thickness of at least 1 micrometer (μm) and most 18 micrometer (μm), and wherein the second metal layer is made of one or more than one metal selected from Cu, Ag, Au, Ni, and Al or an alloy containing any of these metals as its main component.

14. The method of manufacturing a printed board according to claim 1,
wherein, in forming the through-hole, the protective layer formed on the laminate thermally contracts by the laser beam, and
wherein a thermal contraction width on a side of the first metal layer is greater than a thermal contraction width on a side of the second metal layer.

15. The method of manufacturing a printed board according to claim 1,
wherein, in forming the through-hole, the protective layer on the second metal layer thermally contracts such that decomposed matter is formed on an exposed portion of the second metal layer, and
wherein, in forming the through-hole, a thermal contraction width of the protective layer on the second metal layer is less than or equal to half of a thermal contraction width of the protective layer on the first metal layer.

16. The method of manufacturing a printed board according to claim 15,
wherein the third metal layer continuously covers the first metal layer, the decomposed matter on the first metal layer, the second metal layer, the decomposed matter on the second metal layer, and the inner side surface of the through-hole.

17. The method of manufacturing a printed board according to claim 16,
wherein, in forming the through-hole, a size of the decomposed matter formed on the exposed portion of the first metal layer is about 10 micrometer (μm).

18. The method of manufacturing a printed board according to claim 1,
wherein, in forming the through-hole, a size of the decomposed matter formed on the exposed portion of the first metal layer is about 10 micrometer (μm).

19. The method of manufacturing a printed board according to claim 1,
wherein, in forming the through-hole, the laminate on which the protective layer is formed is irradiated with the laser beam so as to circularly scan laser-beam irradiation areas multiple times.

* * * * *